(12) United States Patent
Walker

(10) Patent No.: US 7,236,416 B2
(45) Date of Patent: Jun. 26, 2007

(54) METHOD AND SYSTEM FOR CONTROLLING REFRESH IN VOLATILE MEMORIES

(75) Inventor: Robert Michael Walker, Raleigh, NC (US)

(73) Assignee: Qualcomm Incorporated, San Diego, CA (US)

( * ) Notice: Subject to any disclaimer, the term of this patent is extended or adjusted under 35 U.S.C. 154(b) by 160 days.

(21) Appl. No.: 11/056,486

(22) Filed: Feb. 10, 2005

(65) Prior Publication Data

US 2005/0259493 A1 Nov. 24, 2005

Related U.S. Application Data

(60) Provisional application No. 60/573,490, filed on May 21, 2004.

(51) Int. Cl.
*G11C 7/00* (2006.01)
(52) U.S. Cl. ............. 365/222; 365/189.12; 365/230.03
(58) Field of Classification Search ................ 365/222, 365/189.12, 230.03
See application file for complete search history.

(56) References Cited

U.S. PATENT DOCUMENTS 6,134,169 A * 10/2000 Tanaka ....................... 365/222
6,269,433 B1 7/2001 Jones et al.
6,310,814 B1 10/2001 Hampel et al.
6,349,068 B2 * 2/2002 Takemae et al. ............. 365/222
6,611,470 B2 * 8/2003 Hidaka ....................... 365/222
2005/0265102 A1* 12/2005 Remaklus et al. ........... 365/222
2005/0265104 A1* 12/2005 Remaklus et al. ........... 365/222

FOREIGN PATENT DOCUMENTS

EP 1026595 12/1999
WO 9702652 2/1997

* cited by examiner

*Primary Examiner*—David Lam
(74) *Attorney, Agent, or Firm*—Thomas Rouse; Nicholas Pauley; Joseph Agusta

(57) ABSTRACT

A memory system for controlling memory refresh is provided. An embodiment of the memory system includes a memory configured to operate in a self-refresh mode and an auto-refresh mode, the memory having a plurality of memory locations, and a memory controller configured to access a first one of the memory locations while a second one of the memory locations is being refreshed in the auto-refresh mode. Another embodiment of the memory system includes a memory that can communicate its self refresh address to the memory controller. A further embodiment includes a memory controller that can communicate an auto-refresh address to a memory.

26 Claims, 6 Drawing Sheets

METHOD AND SYSTEM FOR CONTROLLING REFRESH IN VOLATILE MEMORIES

RELATED APPLICATIONS

This application claims priority to U.S. Provisional Ser. No. 60/573,490, filed May 21, 2004.

BACKGROUND

1. Field

The present disclosure relates generally to memory devices, and more specifically, to methods and systems for controlling refresh in dynamic volatile memories.

2. Background

Dynamic volatile memory is a storage medium that is commonly structured as a number of arrays (or banks). Each bank is further arranged as a matrix of "memory cells" in rows and columns, with each column being further divided by the input/output (I/O) width of the memory. Locations within the memory are uniquely specified by bank, row and column. A memory controller may be used to retrieve data from the memory by indicating the data's bank, row and column location.

In the case of dynamic volatile memories (volatile memories), each cell must be refreshed, or re-energized, periodically in order to maintain data integrity. The cells have to be refreshed because they discharge over time. Refresh is the process of recharging, or re-energizing, the cells in memory. Cells are generally refreshed one row at a time. A number of methods currently exist that are designed to refresh volatile memories. Some, if not all, of these methods incur high cost in performance and/or power. For example, there are a number common methods or techniques that are generally used to control the refresh of volatile memories in modem digital systems. One method, typically known as self-refresh, relies on the memory to control timing of the refresh operations to be performed on the desired rows and banks; the other method, typically known as auto-refresh, relies on a memory controller to control timing of the refresh operations to be performed on the desired rows and banks. With these two methods, however, the memory controller and the memory do not have any means to convey to each other the information relating to the row and bank to be refreshed.

Under the self-refresh method, the memory utilizes its own internal refresh clock and the refresh address stored in an internal refresh address register to control refresh operations. During periods when data is not being written to or retrieved from the memory (idle states), the memory controller may place the memory in the self-refresh mode. In the self-refresh mode, the memory uses its own internal refresh mechanism to refresh the row(s) of memory and control the internal refresh address register. The self-refresh mode is good for saving power during idle states since the self-refresh mode uses a relatively small amount of power. Due to the small amount of power needed, this method is commonly used for low power applications. However, this method is inefficient during active cycles, because access to the memory is shut down completely (i.e., all rows closed) for a refresh cycle to be performed.

The auto-refresh method is typically employed during active use of the memory. In auto-refresh mode, the memory controller provides an auto-refresh command that is to be used by the memory to perform the refresh operations. The memory uses the refresh address in its internal refresh address register to determine which row/bank to perform the refresh cycle and cycle through the relevant rows based on the auto-refresh command provided by the memory controller. Similarly, when the memory enters the auto-refresh state, all banks have to be closed to access by the memory controller because the memory controller has no knowledge as to which bank is going to be refreshed by the memory.

Hence, it would be desirable to provide more efficient methods and systems for refreshing volatile memories, which are capable of achieving higher performance while maintaining a low power budget.

SUMMARY

In one embodiment, a memory system includes a memory configured to operate in a self-refresh mode and an auto-refresh mode, the memory having a plurality of memory locations, and a memory controller configured to access a first one of the memory locations while a second one of the memory locations is being refreshed in the auto-refresh mode.

In one aspect, a method of refreshing memory having a self-refresh mode and an auto-refresh mode is provided, the memory having a plurality of memory locations, the method comprising providing a memory controller with access to a first one of the memory locations in the memory while a second one of the memory locations is being refreshed while operating in the auto-refresh mode.

In another embodiment, a memory configured to operate in a self-refresh mode and an auto-refresh mode includes a plurality of memory banks being configured such that a first one of the memory banks is accessible to an external device while one or more of a plurality of memory locations in a second one of the memory banks are being refreshed in the auto-refresh mode.

In yet another embodiment, a memory controller configured to control a memory having a plurality of memory banks in an auto-refresh mode and a self-refresh mode is provided, the memory controller comprising an address queue configured to store memory addresses for accessing the memory, and refresh address logic configured to receive from the address queue a memory address to a first one of the memory banks, and a refresh address to a second one of the memory banks, the refresh address logic being further configured to provide the memory address from the address queue to the memory in the auto-refresh mode if the first one of the memory banks is different from the second one of the memory banks.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

Figure 1:
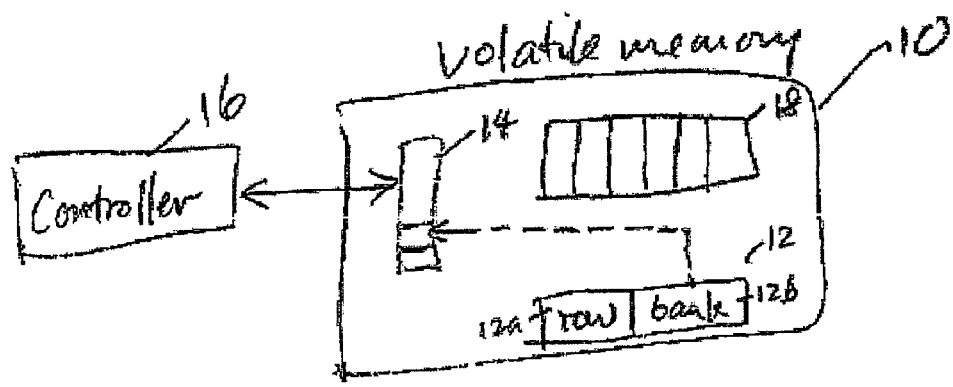
FIG. 1 is a simplified schematic diagram illustrating one embodiment of a volatile memory with a memory controller.

FIG. 1 illustrates one embodiment of a volatile memory 10 with a memory controller 16. The volatile memory 10 can be, for example, a DRAM (dynamic random access memory), a SDRAM (synchronous DRAM), and various other types of DRAM, etc. The volatile memory 10 may further include a number of memory banks 18, an internal refresh address register 12 and a readable register 14. The internal refresh address register 12 is used to store the refresh address (i.e., the row address 12a and the bank address 12b) of the target location that is to be refreshed within the memory banks 18. The readable register 14 is accessible to the memory controller 16 and can be any type of register including, for example, a mode register, an extended mode register or a separate register configured to store the refresh address. The mode register and the extended mode register are programmable and are used to store operational information relating to the volatile memory 10, such as, input/output drive strength, CAS (column address strobe) latency settings, burst length settings, etc. Such operational information is used by the memory 10 and the memory controller 16 to effect various functions including, for example, defining operation mode, signaling and data strobing functions and power savings features.

Figure 2:
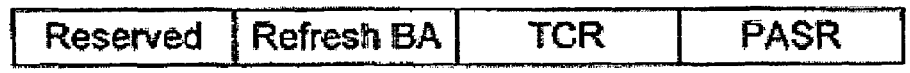
FIG. 2 is a simplified schematic diagram illustrating the contents of a register of a volatile memory.

In one embodiment, the bank address 12b stored in the refresh address register 12 is retrieved and loaded into the readable register 14 of the memory 10. FIG. 2 illustrates the contents of an extended mode register of the volatile memory 10. As shown in FIG. 2, the bank address 12b is now also stored in the extended mode register 14. By adding the bank address 12b of the refresh address register 12 to the readable register 14, the memory controller 16 of the volatile memory 10 can then read the bank address 12b after the power up sequence and each time the memory 10 comes out of self-refresh. By knowing the bank address 12b that the refresh address register 12 is pointing to, the memory controller 16 only has to precharge the targeted location or bank in the memory banks 18 based on the bank address 12b for auto-refresh, as opposed to all the memory banks 18 in the memory 10. In other words, only one bank as identified by the bank address 12b needs to be closed. Conversely, this means other banks in the memory banks 18 remain available, which allows the memory controller 16 to continue to access these other banks at will while the auto-refresh cycle is being performed on the targeted bank.

Figure 3A:
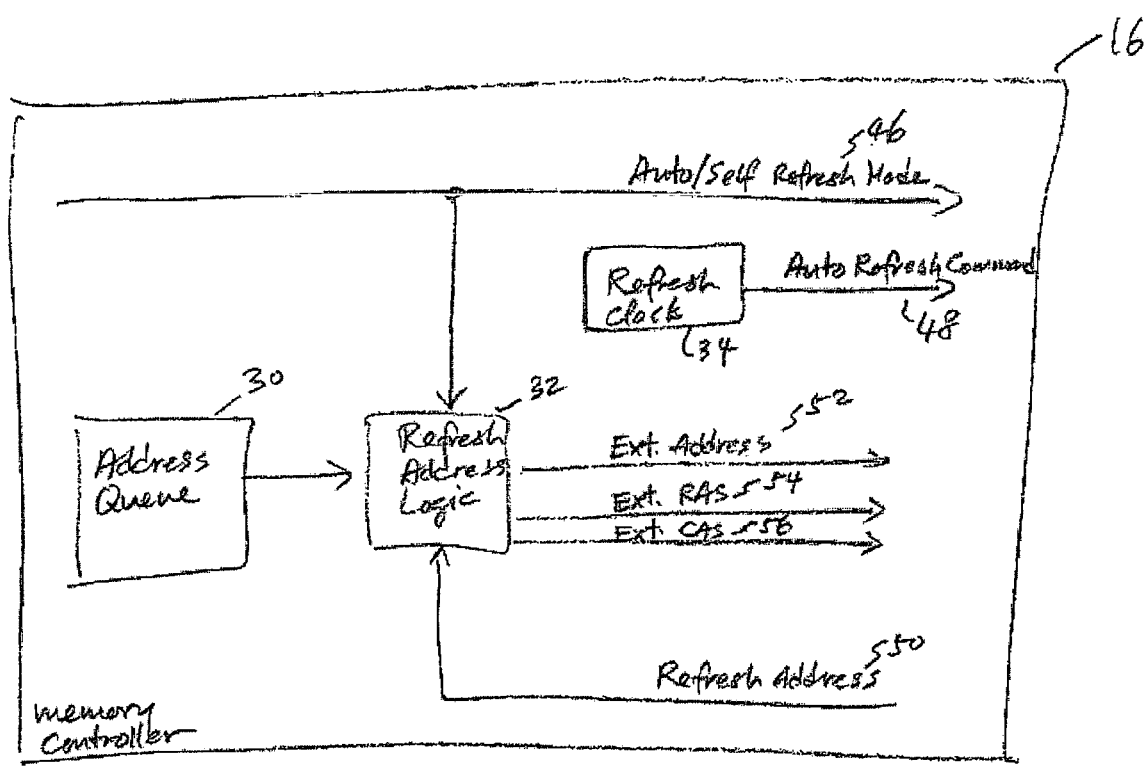
FIGS. 3A and 3B are simplified schematic diagrams respectively further illustrating embodiments of the volatile memory and the memory controller as shown in FIG. 1.
Figure 3B:
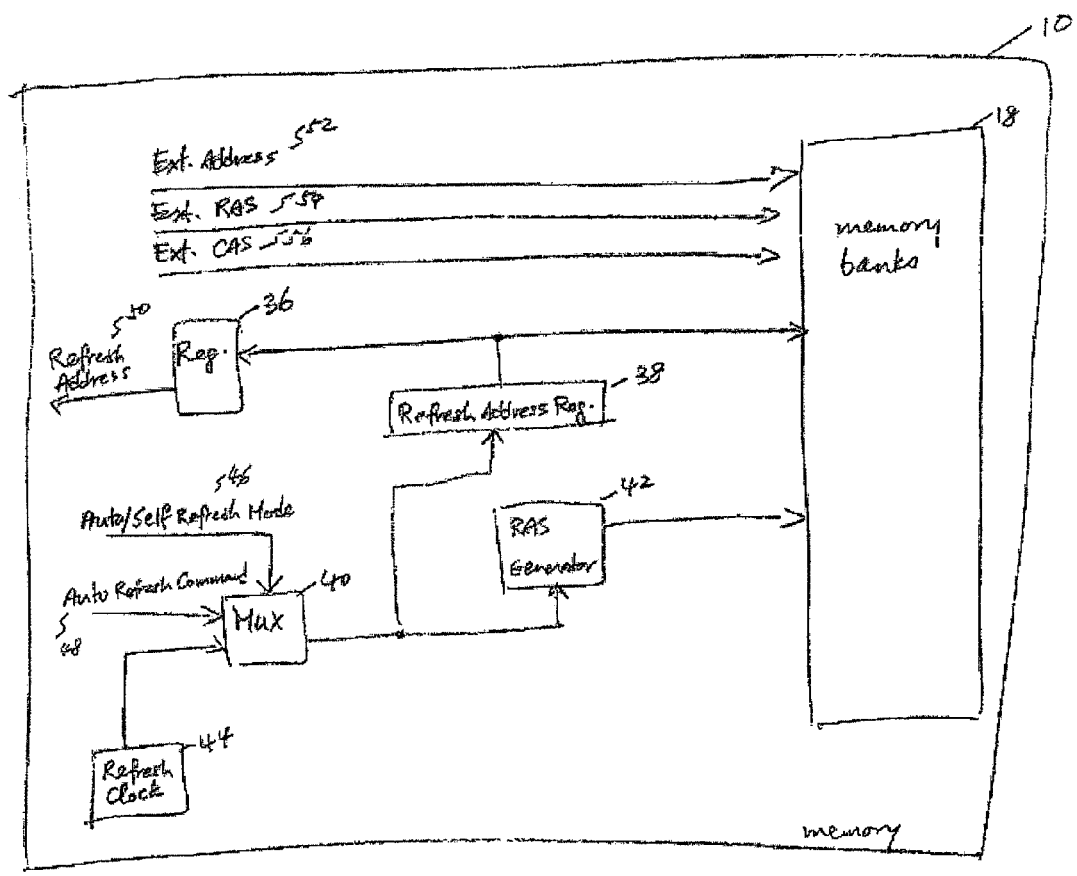

FIGS. 3A and 3B respectively further illustrate embodiments of the volatile memory 10 and the memory controller 16 as shown in FIG. 1. As shown in FIGS. 3A and 3B, the memory controller 16 may include an address queue 30, refresh address logic 32 and a refresh clock 34; and the memory 10 may include a register 36, a refresh address register 38, a multiplexer 40, a RAS (row address strobe) generator 42, a refresh clock 44 and a number of memory banks 18.

The memory 10 and the memory controller 16 interact with each other as follows. The address queue 30 is used to store a number of addresses that are to be used to access the memory banks 18. The refresh address logic 32 controls the sequence of addresses from the address queue 30 that are used to access the memory 10. For each address used to access the memory, the refresh address logic 32 also generates a RAS 54 to open a new row or page in the memory 10 (if required), and a CAS (column address strobe) 56 to access the column indicated by the address.

In the situation where the memory controller 16 wishes to direct the memory 10 to go into self-refresh mode, the memory controller 16 provides the appropriate signal to the memory 10 via the auto/self refresh mode signal 46. Upon receiving the auto/self refresh mode signal 46 indicating that the self-refresh mode is to be initiated, the multiplexer 40 selects the signal from the refresh clock 44 as the refresh command and uses it to control the refresh address register 38 and drive the RAS generator 42. During each refresh cycle, the address stored in the refresh address register 38 is then used to refresh the corresponding memory location in the memory banks 18 (via an RAS from the RAS generator 42), and the address is also provided to the register 36 for storage. As a result, the last refreshed memory location is therefore accessible to the memory controller 16 via the register 36 when the memory 10 comes out of the self-refresh mode.

An auto/refresh mode signal 46 may be used by the memory controller 16 to bring the memory 10 out of the self-refresh mode and into the auto-refresh mode. In the auto-refresh mode, the memory controller 16 uses its own refresh clock 34 to provide the auto-refresh command 48. Upon receiving the auto/self refresh mode signal 46 indicating that the auto-refresh mode is to be initiated, the multiplexer 40 selects the auto-refresh command 48 provided by the memory controller 16 to control the refresh address register 38 and drive the RAS generator 42. During each refresh cycle, the address stored in the refresh address register 38 is then used to refresh the corresponding memory location in the memory banks 18, and the address is also provided to the register 36 for storage.

The address of the memory location being refreshed is provided to the memory controller 16 via the register 36 in the memory 10. The refresh address logic 32 is then able to ensure that an address from the address queue 30 used to access the memory 10 does not conflict with the memory location being refreshed. As a result, memory may be accesses concurrently with a refresh operation in auto-refresh mode.

Figure 4:
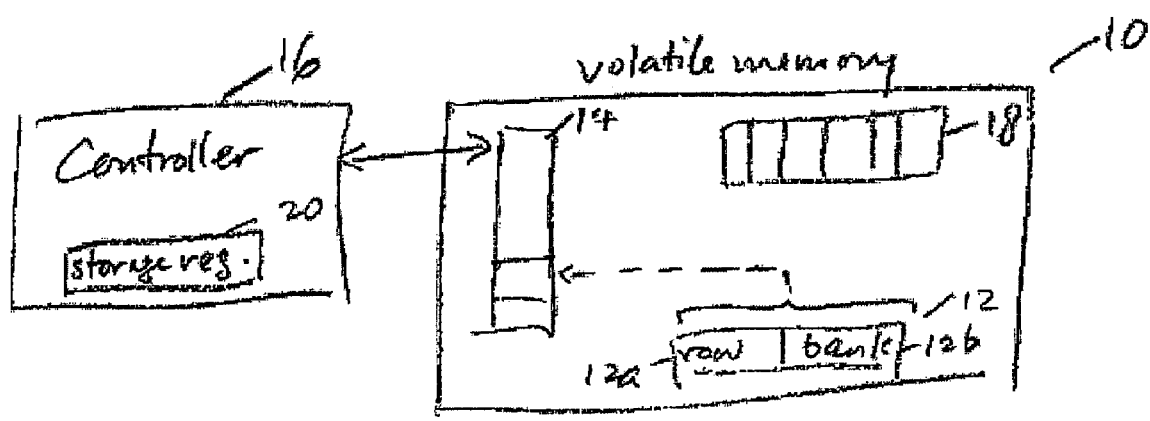
FIG. 4 is a simplified schematic diagram illustrating another embodiment of a volatile memory with a memory controller.

FIG. 4 illustrates another embodiment of the memory controller and memory. As shown in FIG. 4, both the row address 12a and the bank address 12b are loaded into the readable register 14 from the refresh address register 12. The memory controller 16 then reads the row address 12a and the bank address 12b from the readable register 14. The row address 12a and the bank address 12b are also stored by the inventory controller 16 in a storage register 20 associated with the memory controller 16. The purpose of the storage register 20 will be further described below.

Figure 5A:
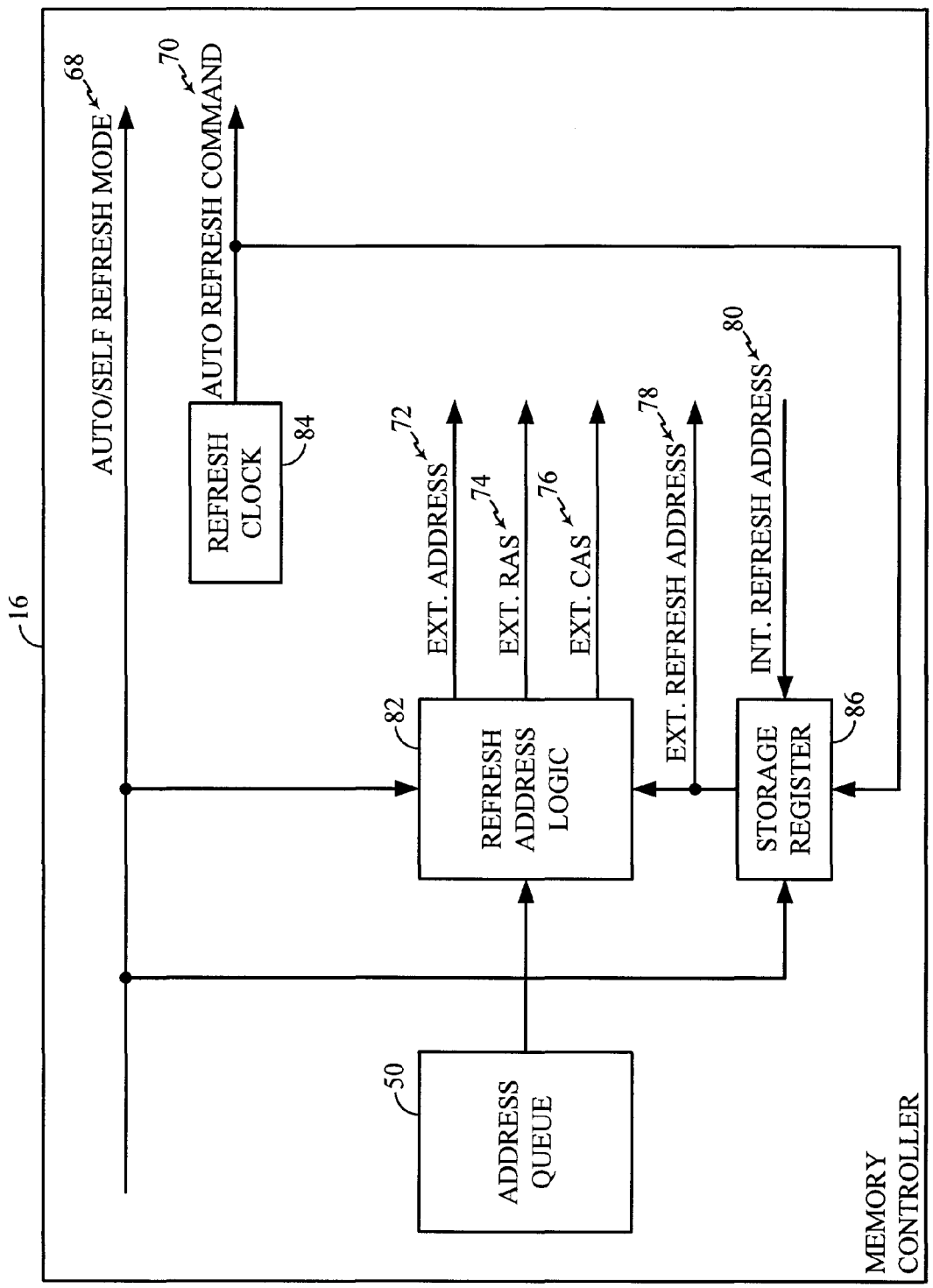
FIGS. 5A and 5B are simplified schematic diagrams respectively further illustrating embodiments of the volatile memory and the memory controller as shown in FIG. 4.
Figure 5B:
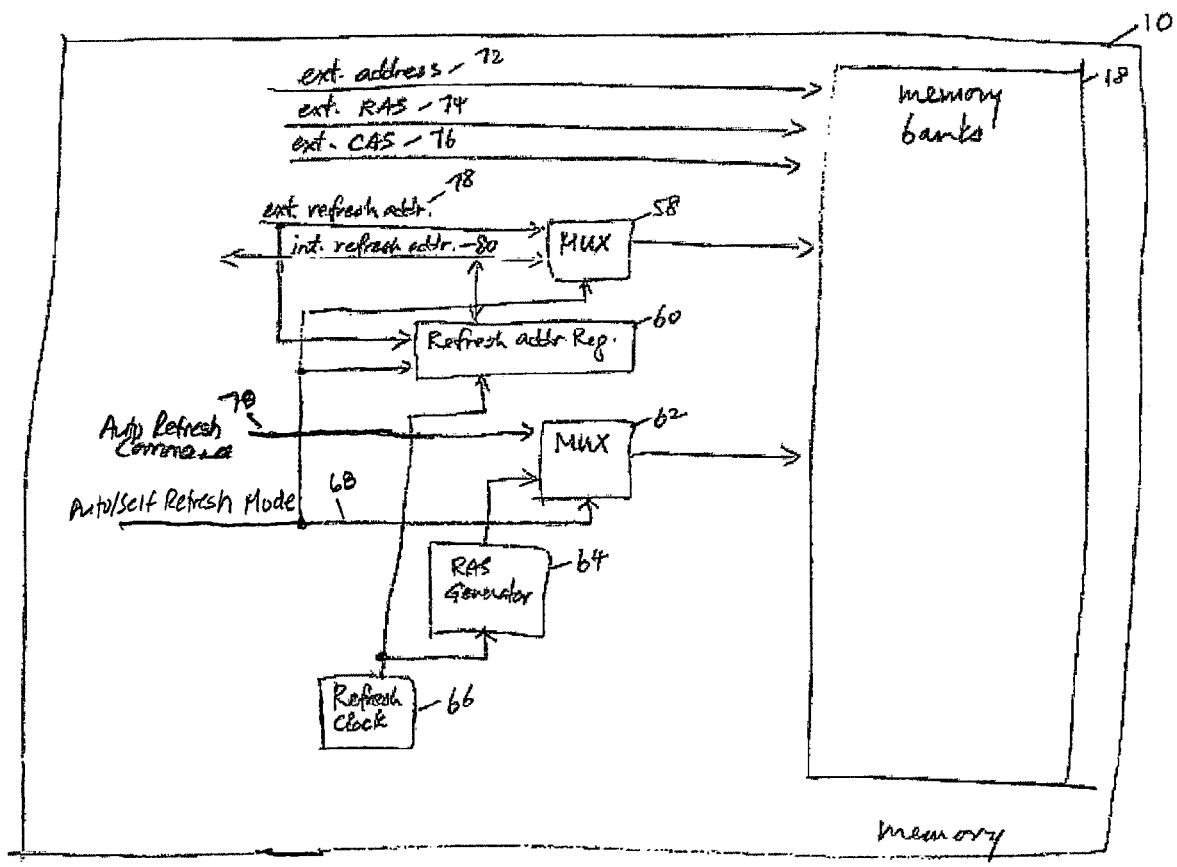

FIGS. 5A and 5B respectively further illustrate embodiments of the volatile memory 10 and the memory controller 16 as shown in FIG. 4. As shown in FIGS. 5A and 5B, the memory controller 16 may include an address queue 50, refresh address logic 82, a refresh clock 84 and a storage register 86; and the memory 10 may include a refresh address register 60, first and second multiplexers 58, 62, a RAS generator 64, a refresh clock 66 and a number of memory banks 18.

The memory 10 and the memory controller 16 interact with each other as follows. The address queue 50 is used to store a number of addresses that are to be used to access the memory banks 18. The refresh address logic 82 controls the sequence of addresses from the address queue 50 that are used to access the memory 10. For each address used to access the memory, the refresh address logic 82 also generates a RAS 74 to open a new row or page in the memory 10 (if required), and a CAS (column address strobe) 76 to access the column indicated by the address.

In the situation where the memory controller 16 wishes to direct the memory 10 to go into self-refresh mode, the memory controller 16 provides the appropriate signal to the memory 10 via the auto/self refresh mode signal 68. Upon issuance of the auto/self refresh mode signal 68 indicating that the self-refresh mode is to be initiated, the memory controller 16 also outputs the address stored in the storage register 86 as the external refresh address 78 to the memory 10. The memory 10 may then load the external refresh address 78 into the refresh address register 60. Upon receiving the auto/self refresh mode signal 68 indicating that the self-refresh mode is to be initiated, the refresh clock 66 is used to provide a refresh command to control the refresh address register 60 and drive the RAS generator 64. As a result, during the self-refresh mode, the refresh address register 60 is periodically incremented to provide addresses for memory locations to be refreshed via a first multiplexer 58. In addition, the memory locations specified by the addresses from the refresh address register 60 are refreshed by the RAS from the RAS generator 64 via the second multiplexer 62.

The memory controller 16 may also direct the memory 10 to enter the auto-refresh mode via the auto/refresh mode signal 68. In the situation where the memory controller 16 directs the memory 10 to transition from the self-refresh mode to the auto-refresh mode, the address stored in the refresh address register 60 is provided to the storage register 86 in the memory controller 16. At the conclusion of the self-refresh mode, it should be noted that the refresh address register 60 contains the address of the last refreshed memory location in the memory banks 18. By making this address available to the memory controller 16 at the beginning of the auto-refresh mode, the memory controller may direct subsequent refresh operations to be performed on specific memory locations in the auto-refresh mode, as will be further described below.

With the storage register 86 loaded with the last refreshed memory location, the memory controller 16 may use its own refresh clock 54 not only to generate the auto-refresh command signal 70, but to control the addresses of the refresh operations. In this particular configuration the auto-refresh command signal 70 generated by the refresh clock 84 is used to increment the storage register 86 to derive the next memory location to be refreshed. The auto-refresh command signal 70 is also provided to the memory 10. The output of the storage register 86 is provided to the memory 10 to control the memory location of the refresh operation. Multiplexers 58 and 62 in the memory 10 may be used to provide the address from the storage register 86, as well as the auto refresh command signal 70 from the refresh clock 84, to the memory 10.

In addition, the external refresh address 78 is also provided to the refresh address logic 82. The refresh address logic 82 is then able to ensure that an address from the address queue 50 used to access the memory 10 does not conflict with the memory location being refreshed. As a result, memory may be accesses concurrently with a refresh operation in auto-refresh mode. Accompanying each address from the address queue is an external RAS and CAS 74, 76 to access the memory 10.

At the conclusion of the auto-refresh mode, the address stored in the storage register 86 (representing the last refreshed memory location) may be loaded into the refresh address register 60 in the memory 10. By making this address available, the memory controller 16 may safely direct the memory 10 to enter into self-refresh mode ensuring that the memory location that would have been refreshed next in the auto refresh mode is refreshed next in the self refresh mode.

The methods or algorithms described in connection with the embodiments disclosed herein may be embodied directly in hardware, in a software module executable by a processor, or in a combination of both, in the form of control logic, programming instructions, or other directions. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A memory system, comprising:
   a memory configured to operate in a self-refresh mode and an auto-refresh mode, the memory having a plurality of memory locations; and a memory controller configured to access a first one of the memory locations while a second one of the memory locations is being refreshed in the auto-refresh mode, wherein the memory comprises a plurality of memory banks, the first one of the memory locations being located in a first one of the memory banks and the second one of the memory locations being located in a second one of the memory banks, wherein the memory further comprises a refresh address register configured to sequence through a plurality of memory addresses in the self-refresh mode, each of the memory addresses corresponding to one of the memory locations to be refreshed in the self-refreshed mode, and wherein the memory controller has access to the refresh address register, wherein the memory further comprises a readable register coupled to the refresh address register, the memory controller having access to the refresh address register through the readable register.

2. The memory system of claim 1 wherein the readable register includes the refresh address register.

3. The memory system of claim 1 wherein the memory is further configured to use the addresses in the refresh address register when operating in the auto-refresh mode.

4. The memory system of claim 3 wherein the memory controller is further configured to provide an auto-refresh command to the memory in the auto-refresh mode, and the memory is further configured to change the address in the refresh address register in response to the auto-refresh command.

5. The memory system of claim 1 wherein the memory controller further comprises a register configured to load the address from the refresh address register when transitioning from the self-refresh mode to the auto-refresh mode.

6. The memory system of claim 5 wherein the memory controller register is further configured to sequence through a plurality of addresses in the auto-refresh mode, and use the addresses in the memory controller register to refresh the memory in the auto-refresh mode.

7. The memory system of claim 6 wherein the memory controller is further configured to provide the address in the memory controller register to the memory when transitioning from the auto-refresh mode to the self-refresh mode.

8. The memory system of claim 7 wherein the memory is further configured to load the address received from the memory controller into the refresh address register.

9. A method of refreshing memory having a self-refresh mode and an auto-refresh mode, the memory having a plurality of memory locations, the method comprising:
providing a memory controller with access to a first one of the memory locations in the memory while a second one of the memory locations is being refreshed while operating in the auto-refresh mode, wherein the memory comprises a plurality of memory banks, the first one of the memory locations being located in a first one of the memory banks and the second one of the memory locations being located in a second one of the memory banks, wherein the memory further comprises a refresh address register configured to sequence through a plurality of memory addresses in the self-refresh mode, each of the memory addresses corresponding to one of the memory locations to be refreshed in the self-refresh mode; and
providing the memory controller with access to the address in the refresh address register, wherein the memory controller is provided access to the address in the refresh address register by loading the address into a readable register in the memory, and reading the address from the readable register into the memory controller.

10. The method of claim 9 wherein the readable register comprises a mode register.

11. The method of claim 9 wherein the refresh address register is further configured to sequence through a plurality of memory addresses in the auto-refresh mode, the method further comprising using the addresses in the refresh address register to refresh corresponding memory locations while operating in the auto-refresh mode.

12. The method of claim 11 further comprising providing an auto-refresh command from the memory controller to the memory while operating in the auto-refresh mode, and changing the address in the refresh address register in response to the auto-refresh command.

13. The method of claim 9 further comprising loading the address from the refresh address register into a register in the memory controller at the beginning of the auto-refresh mode.

14. The method of claim 13 wherein the memory controller is further configured to sequence through a plurality of memory addresses in the auto-refresh mode, the method further comprising using the addresses in the memory controller register to refresh corresponding memory locations while operating in the auto-refresh mode.

15. The method of claim 14 further comprising transitioning from the auto-refresh mode to the self-refresh mode, and providing the address in the memory controller register to the memory during the transition.

16. The method of claim 15 further comprising loading the address received by the memory from the memory controller into the refresh address register.

17. A memory configured to operate in a self-refresh mode and an auto-refresh mode, comprising:
a plurality of memory banks being configured such that a first one of the memory banks is accessible to an external device while one or more memory locations in a second one of the memory banks are being refreshed in the auto-refresh mode;
a refresh address register configured to sequence through a plurality of memory addresses in the self-refresh mode, each of the memory addresses corresponding to one of the memory locations to be refreshed in the self-refresh mode, the refresh address register being accessible to the external device; and
a readable register, the refresh address register being accessible to the external device through the readable register.

18. The memory of claim 17 wherein the readable register comprises a mode register.

19. The memory of claim 17 further comprising a strobe generator configured to generate a strobe for each one of the memory locations to be refreshed, the strobe generator being controlled internally during the self-fresh mode, the memory further being configured to provide external control of the strobe generator in the auto-refresh mode.

20. The memory of claim 17 further comprising a refresh strobe generator configured to generate a refresh strobe for each one of the memory locations to be refreshed during the self-refresh mode, the memory being further configured to receive a refresh strobe from the external device for each one of the memory locations to be refreshed the auto-refresh mode.

21. The memory of claim 17 wherein the memory is further configured to received a sequence of memory addresses from the external device during the auto-refresh mode, each of the received memory addresses being used to refresh a corresponding one of the memory locations.

22. The memory of claim 17 wherein the refresh address register is loadable from the external device.

23. A memory controller configured to control a memory having a plurality of memory banks in an auto-refresh mode and a self-refresh mode, the memory controller comprising:
   an address queue configured to store memory addresses for accessing the memory;
   refresh address logic configured to receive from the address queue a memory address to a first one of the memory banks, and a refresh address to a second one of the memory banks, the refresh address logic being further configured to provide the memory address from the address queue to the memory in the auto-refresh mode if the first one of the memory banks is different from the second one of the memory banks, wherein the refresh address is controlled internally in the auto-refresh mode; and
   a storage register, the storage register being loadable with a refresh address from the memory during a transition from the self-refresh mode to the auto-refresh mode.

24. The memory controller of claim 23 further comprising a refresh strobe generator configured to generate a refresh strobe, the refresh strobe being provided to the memory during the auto-refresh mode, and being used to change the refresh address in the storage register during the auto-refresh mode.

25. A memory controller configured to control a memory having a plurality of memory banks in an auto-refresh mode and a self-refresh mode, the memory controller comprising:
   an address queue configured to store memory addresses for accessing the memory;
   refresh address logic configured to receive from the address queue a memory address to a first one of the memory banks, and a refresh address to a second one of the memory banks, the refresh address logic being further configured to provide the memory address from the address queue to the memory in the auto-refresh mode if the first one of the memory banks is different from the second one of the memory banks, wherein the refresh address is controlled by an external source during the auto-refresh mode; and
   a storage register, the storage register being loadable with a refresh address from the memory during a transition from the self-refresh mode to the auto-refresh mode.

26. The memory controller of claim 25 further comprising a refresh strobe generator configured to generate a refresh strobe, the refresh strobe being provided to the memory during the auto-refresh mode, and being used to change the refresh address in the storage register during the auto-refresh mode.

* * * * *